(12) United States Patent  
Pushkarsky et al.

(10) Patent No.: US 9,147,995 B2  
(45) Date of Patent: Sep. 29, 2015

(54) RAPIDLY TUNABLE LASER SOURCE ASSEMBLY WITH LONG STROKE GRATING MOVER

(71) Applicant: DAYLIGHT SOLUTIONS, INC., San Diego, CA (US)

(72) Inventors: Michael Pushkarsky, San Diego, CA (US); John Martin Algots, San Diego, CA (US); Satino Marrone, Poway, CA (US); John Craig, Poway, CA (US); Alexander Dromaretsky, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 103 days.

(21) Appl. No.: 13/834,607

(22) Filed: Mar. 15, 2013

(65) Prior Publication Data

US 2014/0269808 A1    Sep. 18, 2014

(51) Int. Cl.
| | |
|---|---|
| H01S 3/08 | (2006.01) |
| H01S 5/022 | (2006.01) |
| H01S 5/14 | (2006.01) |
| H01S 5/024 | (2006.01) |
| H01S 5/34 | (2006.01) |

(52) U.S. Cl.
CPC ......... H01S 5/02208 (2013.01); H01S 5/02252 (2013.01); H01S 5/141 (2013.01); H01S 5/02288 (2013.01); H01S 5/02415 (2013.01); H01S 5/02423 (2013.01); H01S 5/3402 (2013.01)

(58) Field of Classification Search
CPC ... H01S 3/10; H01S 3/10023; H01S 3/08009; H01S 5/141; H01S 5/0687; H01S 3/1055; H01S 5/0683; H01S 5/042; H01S 5/06832; H01S 3/042; H01S 5/02415; H01S 3/025; H01S 3/086; H01S 3/034; H01S 3/02; H01S 3/005; G01C 15/004
USPC .......... 372/20, 102, 107, 109, 29.01, 29.015, 372/34; 257/685, 731; 438/25–28, 121, 438/125; 359/823–824, 196.1–221.2
See application file for complete search history.

(56) References Cited

U.S. PATENT DOCUMENTS

| | | | | |
|---|---|---|---|---|
| 5,319,668 | A | * | 6/1994 | Luecke .......................... 372/107 |
| 5,995,521 | A | * | 11/1999 | Moore et al. .................... 372/20 |
| 6,134,257 | A | | 10/2000 | Capasso et al. |
| 6,400,744 | B1 | | 6/2002 | Capasso et al. |
| 7,424,042 | B2 | | 9/2008 | Day et al. |
| 7,466,734 | B1 | | 12/2008 | Day et al. |
| 7,492,806 | B2 | | 2/2009 | Day et al. |
| 7,535,656 | B2 | | 5/2009 | Day et al. |
| 7,535,936 | B2 | | 5/2009 | Day et al. |
| 7,733,925 | B2 | | 6/2010 | Pushkarsky et al. |
| 7,796,341 | B2 | | 9/2010 | Day et al. |

(Continued)

*Primary Examiner* — Jessica Stultz  
*Assistant Examiner* — Delma R Forde  
(74) *Attorney, Agent, or Firm* — Roeder & Broder LLP

(57) ABSTRACT

A laser assembly (10) that generates a beam (12) includes (i) a gain medium (22) that generates the beam (12) when electrical power is directed to the gain medium (22); (ii) a grating (32) positioned in a path of the beam (12); (iii) a grating arm (34) that retains the grating (32); and (iv) a mover assembly (36) that moves the grating arm (34) about a pivot axis (38). The mover assembly (36) includes a coarse mover (344) that makes large scale movements to the grating arm (34), and a fine mover (352) that makes fine movements to the grating arm (34). With this design, the mover assembly (36) can quickly and accurately move the grating (32) over a relatively large range.

18 Claims, 17 Drawing Sheets

(56) References Cited

U.S. PATENT DOCUMENTS

| | | |
|---|---|---|
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 8,442,081 B2 | 5/2013 | Marsland, Jr. et al. |
| 8,467,430 B2 | 6/2013 | Caffey et al. |
| 8,565,275 B2 | 10/2013 | Pushkarsky et al. |
| 2002/0024979 A1* | 2/2002 | Vilhelmsson et al. .......... 372/20 |
| 2003/0007148 A1* | 1/2003 | Moon et al. .................... 356/328 |
| 2003/0007523 A1* | 1/2003 | Chapman et al. ............... 372/20 |
| 2004/0257682 A1* | 12/2004 | Watts ............................ 359/823 |
| 2006/0274811 A1* | 12/2006 | Tanaka et al. ................. 372/102 |
| 2007/0223554 A1* | 9/2007 | Hunter et al. ................. 372/102 |
| 2011/0075689 A1* | 3/2011 | Miyata et al. ................... 372/20 |
| 2011/0096800 A1* | 4/2011 | Weida et al. .................... 372/20 |
| 2011/0194580 A1* | 8/2011 | Algots et al. ..................... 372/55 |

* cited by examiner

RAPIDLY TUNABLE LASER SOURCE ASSEMBLY WITH LONG STROKE GRATING MOVER

RELATED INVENTION

Further, as far as permitted, the contents of U.S. Pat. No. 7,733,925, and entitled "CONTINUOUS WAVELENGTH TUNABLE LASER SOURCE WITH OPTIMUM POSITIONING OF PIVOT AXIS FOR GRATING", with issued on Jun. 8, 2010 are incorporated herein by reference.

BACKGROUND

Lasers sources are useful in many applications. For example, laser sources that generate light in the mid infrared ("MIR") range are useful for absorption spectroscopy applications since many gases of interest have their fundamental vibrational modes in the MIR range, and thus present strong, unique absorption signatures within the MIR range. Unfortunately, many existing laser sources are not capable of quickly and accurately generating light over a broad spectral range.

SUMMARY

A laser assembly that generates an output beam includes (i) a gain medium that generates a beam when electrical power is directed to the gain medium; (ii) a grating positioned in a path of the beam; (iii) a grating arm that retains the grating; and (iv) a mover assembly that moves the grating arm about a pivot axis. In certain embodiments, the mover assembly includes a coarse mover that makes large scale movements of the grating arm, and a fine mover makes fine movements of the grating arm. With this design, the mover assembly can quickly and accurately move the grating over a relatively large range, and the laser assembly is steppable to a wavelength, and can be used to quickly sweep a relatively large wavelength range.

In certain embodiments, the mover assembly can also include (i) a stage that couples the coarse mover to the fine mover in series, (ii) a stage guide that guides the motion of the stage so that the stage moves along a linear stage axis, (iii) a mover connector that connects the coarse mover to the stage; and/or (iv) a resilient assembly that urges rotation of the grating arm in a first rotational direction relative to the pivot axis. The mover connector can transfer force along a coarse force axis that is substantially parallel to the stage axis, while decoupling other forces that is not substantially parallel to the stage axis.

In one embodiment, the fine mover can be coupled to at least one of the stage and the grating arm with a ball and socket type joint. Further, the coarse mover can include a rotary motor, and the fine mover can include a piezoelectric motor.

The present invention is also directed to an optical assembly including (i) an optical element, e.g. an optical lens; (ii) an optical housing including a first rod aperture; (iii) a first rod that extends through the first rod aperture and that is positioned near the optical element; and (iv) an adhesive that fixedly secures the first rod to the optical element and the first rod to the optical housing. Additionally, the optical housing can include a second rod aperture that is spaced apart from the first rod aperture. In this embodiment, the rod apertures can be aligned along an aperture axis. Further, the optical assembly includes a second rod that extends through the second rod aperture and that is positioned near the optical element. In this embodiment, the adhesive fixedly secures the second rod to the optical element and the second rod to the optical housing. With this design, the optical element can be aligned and subsequently fixed in position relatively easily.

In another embodiment, the present invention is directed to a laser assembly including (i) a gain medium, (ii) a control system that directs power to the gain medium, the control system including a feedback assembly that provides feedback regarding the gain medium, and (iii) a temperature controller that controls the temperature of the feedback assembly. In this embodiment, the feedback assembly can include a sense resistor having a relatively high resistance. With this design, the feedback assembly provides feedback relating to the current being directed to the gain medium. Additionally, the laser assembly can include a rigid base. In this embodiment, the feedback assembly is thermally coupled to the base, and the temperature controller can direct a circulation fluid through the base to control the temperature of the base.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
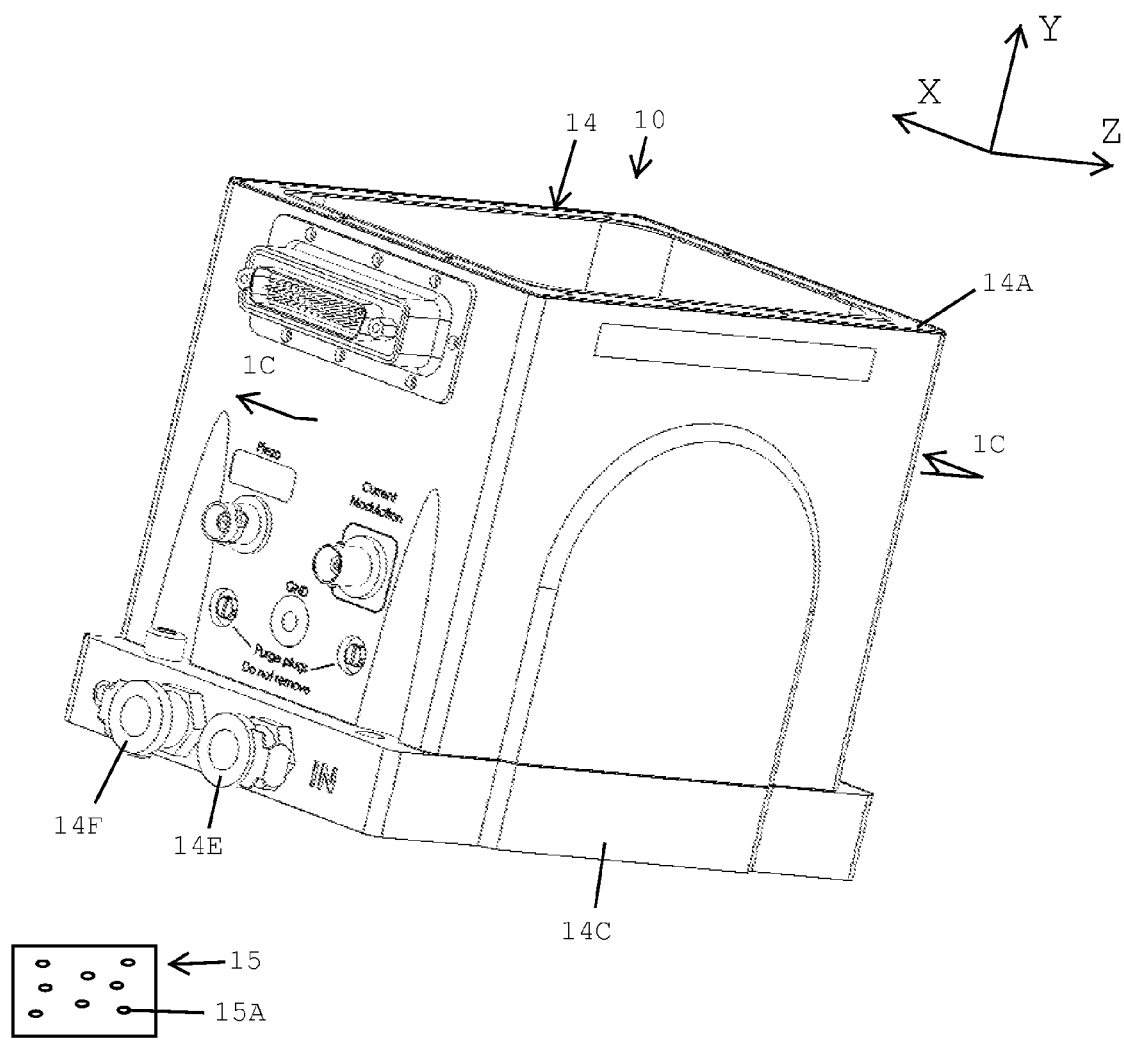
FIGS. 1A and 1B are alternative perspective views of a laser assembly having features of the present invention.
Figure 1B:
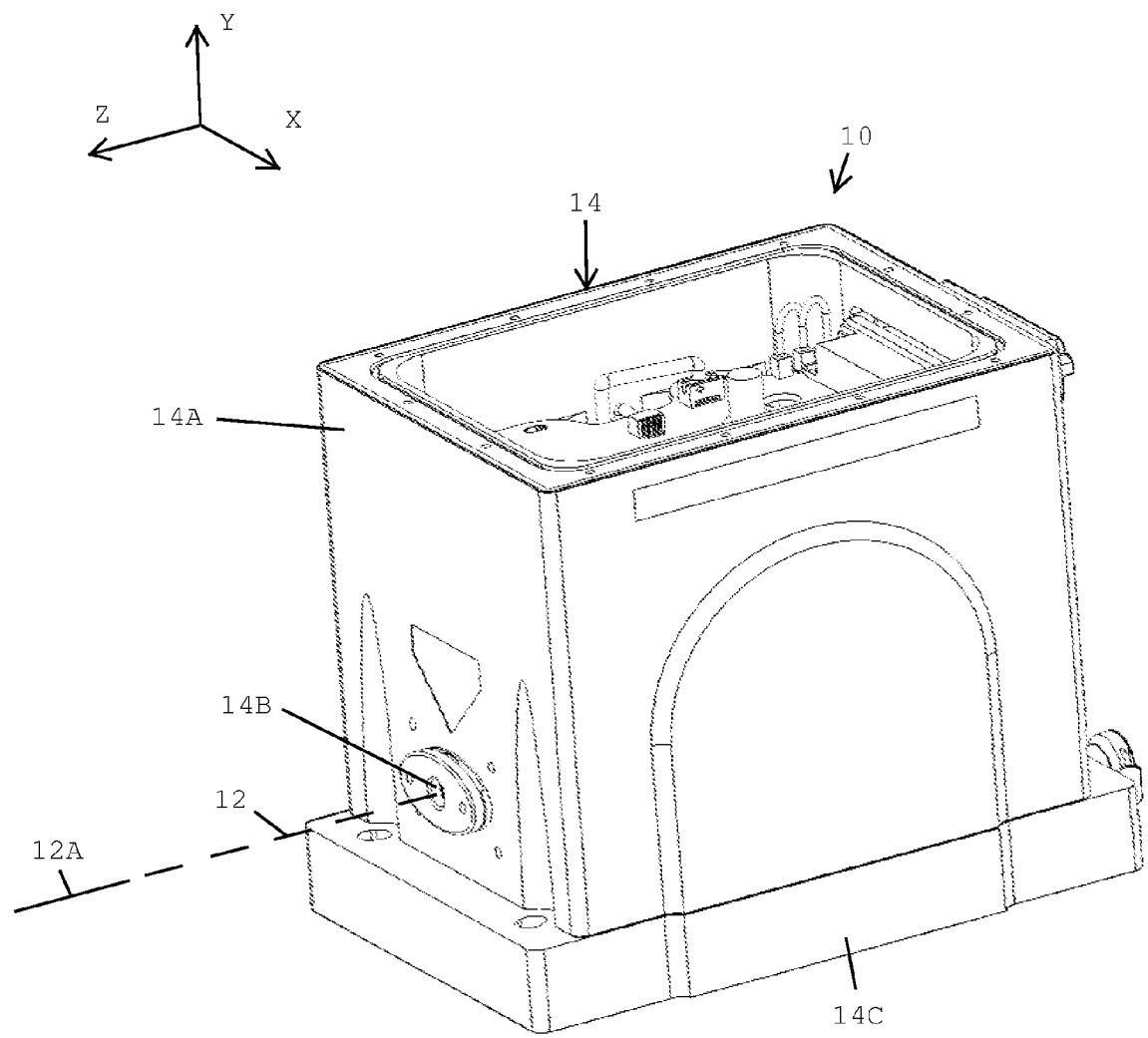

Referring initially to FIGS. 1A and 1B, the present invention is directed to a laser assembly 10 that generates an output beam 12 (illustrated as a dashed line in FIG. 1B) along an output axis 12A. As an overview, in certain embodiments, the laser assembly 10 is uniquely designed so that the output beam 12 includes a set of sequential output pulses of light that span a relatively large, predetermined wavelength range, in a very fast time. Further, in certain embodiments, the laser assembly 10 is compact, broadly tunable, fast tuning, settable to a wavelength, and quickly sweeps the wavelength range. The laser assembly 10 can be operated in continuous wave ("CW") or in a pulsed fashion.

Further, in certain embodiments, the laser assembly 10 is an external cavity (EC), quantum cascade laser (QCL). With this design, the output beam 12 can be characterized by near-diffraction limited divergence, narrow linewidth and specific wavelengths in the MIR spectral range.

As non-exclusive examples, the laser source 10 can be used for imaging, locating, detecting, and/or identifying a substance, e.g. an emitting gas (not shown) and/or other industrial or testing applications. In one embodiment, the laser assembly 10 is designed so that the set of output pulses of light have a center wavelength in the mid-infrared range of approximately 2-20 micrometers. In this embodiment, the laser assembly 10 can be designed to generate an output beam 12 consisting of a set of sequential, specific output pulses of light that span the entire or just a portion of the mid-infrared range. Alternatively, the laser source 10 can be designed to generate one or more output pulses of light having a center wavelength of greater than or lesser than 2-20 micrometers.

Some of the Figures include an orientation system that illustrates an X axis, a Y axis that is orthogonal to the X axis, and a Z axis that is orthogonal to the X and Y axes. It should be noted that these axes can also be referred to as the first, second and third axes. Additionally, the labeling of the orientation system is merely for purposes of reference and the orientation system as provided in the Figures is not intended to define the specific X, Y and Z axes. Rather, the X axis as utilized and/or described herein can be any axis that is parallel to the X axis on the orientation system, the Y axis as utilized and/or described herein can be any axis that is parallel to the Y axis on the orientation system, and the Z axis as utilized and/or described.

The laser assembly 10 can be mounted to a rigid optical bench (not shown) or other structure with or without an additionally temperature controller (not shown) positioned there between.

In FIGS. 1A and 1B, a laser housing 14 of the laser assembly 10 is visible. In this embodiment, the laser housing 14 houses and retains many of the other components of the laser assembly 10. In this non-exclusive embodiment, the laser housing 14 includes (i) a rigid, rectangular tube shaped housing body 14A, (ii) a removable cover (not shown), (iii) a transparent window 14B that allows the output beam 12 to exit the laser housing 14, and (iv) a housing base 14C that retains the components of the laser source 10. In this embodiment, the laser housing 14 is a rigid, generally hollow rectangular shaped box that defines a housing chamber that can provide a controlled environment for many of the components of the laser assembly 10. For example, the laser housing 14 can be hermetically sealed, or can be filled with a desired controlled environment (e.g. an inert gas), or the laser housing 14 can be subjected to vacuum.

The housing base 14C provides structural integrity, and can be fabricated from a single, monolithic structure made of aluminum, copper, copper-tungsten or other material having a sufficiently high thermal conductivity (e.g. at least 150 watts/meter K). Additionally, the housing base 14C can define a fluid passageway 14D (illustrated in FIG. 1C) that includes an inlet 14E and an outlet 14F. With this design, a temperature controller 15 (illustrated as a box in FIG. 1A) can control the temperature of the housing base 14C. For example, the temperature controller 15 can be a circulation system that controls the flow rate and temperature of a circulation fluid 15A (illustrated as small ovals) directed through the housing base 14C to actively control the temperature of the housing base 14C and the components in thermal connection to the housing base 14C.

Figure 1C:
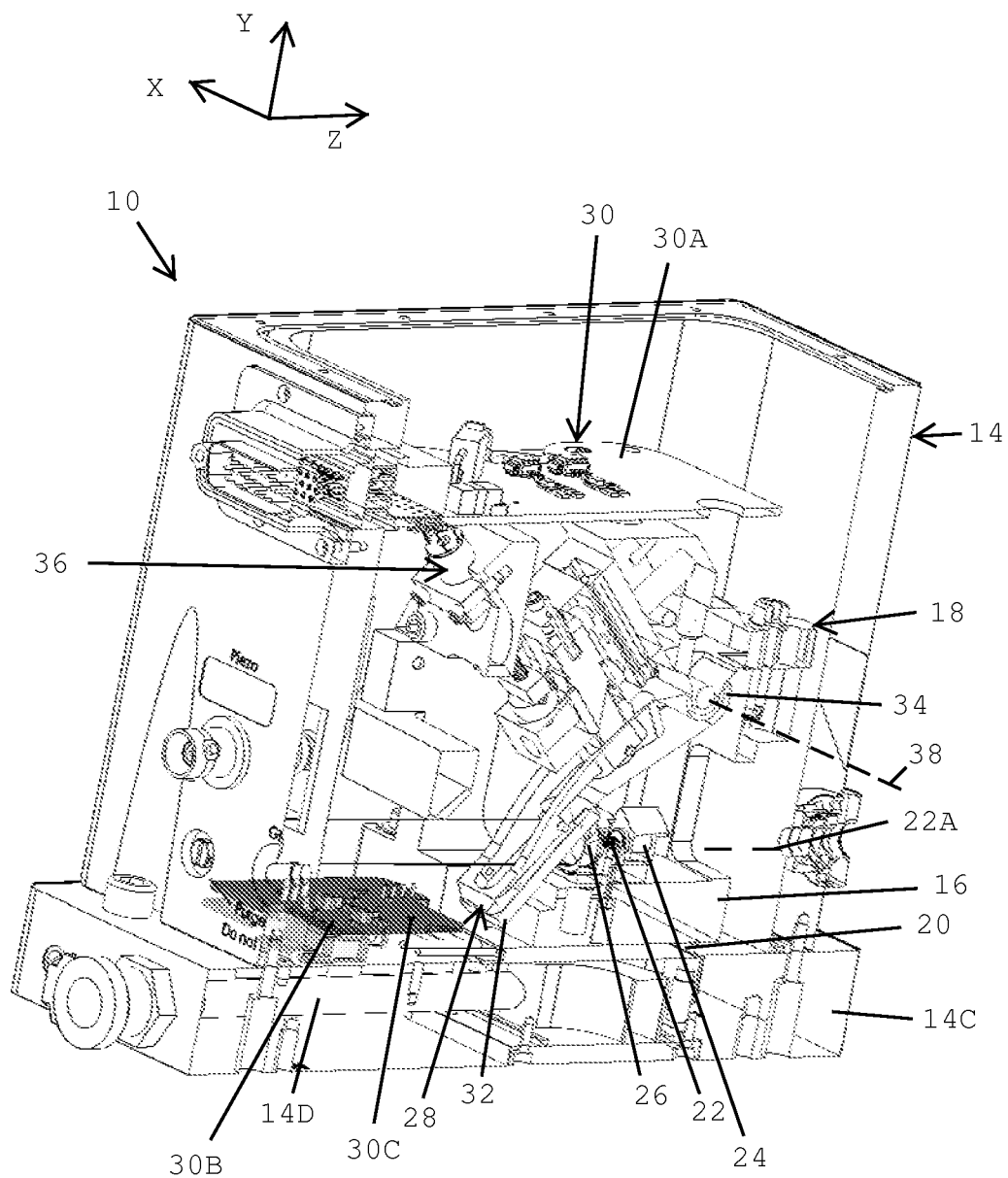
FIG. 1C is a cut-away view taken on line 1C of FIG. 1A.

FIG. 1C is a cut-away view that illustrates many of the components of the laser assembly 10. In this embodiment, the major components of the laser assembly 10 include (i) the laser housing 14, (ii) a mounting base 16, (iii) a frame assembly 18, (iv) a thermoelectric cooler ("TEC") 20, (v) a gain medium 22, (vi) an output optical assembly 24, (vii) a cavity optical assembly 26, (viii) a wavelength dependant ("WD") feedback assembly 28, and (ix) a control system 30. The design of each of these components can be varied pursuant to the teachings provided herein. In should be noted that the laser assembly 10 can be designed with more or fewer components than described above. It should also be noted that the laser assembly 10 can be powered by a generator (not shown), a battery (not shown), or another power source (not shown).

In FIG. 1C, the mounting base 16 is secured to the housing base 14C with the thermoelectric cooler 20 positioned there between. The mounting base 16 can be a single, monolithic structure that provides structural integrity. With this design, the mounting base 16 retains the gain medium 22, and the optical assemblies 24, 26 in a fixed, stable arrangement to maintain these components in precise mechanical alignment, while the WD feedback assembly 28 is moved relative to these fixed components. The mounting base 16 can be fabricated from a single, monolithic structure made of aluminum, copper, copper-tungsten or other material having a sufficiently high thermal conductivity (e.g. at least 150 watts/meter K) to readily transfer heat from the gain medium 22 to the temperature controller 20.

The frame assembly 18 secures the WD feedback assembly 28 to the housing base 14C and allows for the adjustment of the WD feedback assembly 28 relative to the gain medium 22. The frame assembly 18 is described in more detail below.

The temperature controller 20 can control the temperature of the gain medium 22 and the mounting base 16. In one non-exclusive embodiment, the temperature controller is a thermoelectric cooler ("TEC") that has approximately the same footprint as the bottom of the mounting base 16.

The gain medium 22 generates the output beam 12. In one embodiment, the gain medium 22 is a quantum cascade ("QC") gain medium. As used herein, the term QC gain medium 22 shall also include Interband Cascade Lasers (ICL). In one embodiment, the gain medium 22 includes (i) a first facet that faces the cavity optical assembly 26 and the WD feedback assembly 28, and (ii) a second facet that faces the output optical assembly 24. In this embodiment, the gain medium 22 emits from both facets along a lasing axis 22A (e.g., along the Z axis). In one embodiment, the first facet is coated with an anti-reflection ("AR") coating and the second facet is coated with a reflective coating. The AR coating on the first facet allows light directed from the gain medium 22 at the first facet to easily exit the gain medium 22 and allows the light reflected from the WD feedback assembly 28 to easily enter the gain medium 22. In contrast, the reflective coating on the second facet reflects at least some of the light that is directed at the second facet from the gain medium 22 back into the gain medium 22. With this design, the reflective coating on the second facet acts as an output coupler for the external cavity.

The cavity optical assembly 26 is positioned between the gain medium 22 and the WD feedback assembly 28 along the lasing axis 22A, and collimates and focuses the light that passes between these components. The output optical assembly 24 is positioned between the gain medium 22 and the window (not shown) in line with the lasing axis 22A. Additionally, the output optical assembly 24 collimates and focuses the light that exits the second facet of the gain medium 22.

The WD feedback assembly 28 reflects light back to the gain medium 22 along the lasing axis 22A, and is used to precisely adjust the lasing frequency of the external cavity and the wavelength of the output beam 12. In one embodiment, the WD feedback assembly 28 includes a diffraction grating 32, a grating arm 34, and a mover assembly 36 that precisely moves the grating 32. In this embodiment, the grating 32 cooperates with the reflective coating on the second facet of the gain medium 22 to form the external cavity. With this design, movement of the grating face surface of the diffraction grating 32 relative to the gain medium 22 and the incident beam changes the wavelength of the light in the external cavity. Thus, the position of the grating 32 dictates what wavelength will experience the most gain and thus dominate the wavelength of the output beam 12 (illustrated in FIG. 1).

As provided herein, the physical length of the external cavity is equal to the physical distance that a ray of light travels between the second facet and the grating 32. Further, the optical length of the external cavity is equal to the physical lengths of the areas that a ray of light travels through in the external cavity times the individual indexes of refraction of each of the areas. The external cavity optical length takes in account the index of refraction of all objects in the external cavity that influence the movement of the ray in the external cavity.

In one embodiment, the mover assembly 36 selectively moves (e.g. pivots) the grating 32 to rapidly adjust the lasing frequency of the gain medium 22 and the wavelength of the output beam 12. In this embodiment, the grating 32 is selectively pivoted about a pivot axis 38 (e.g. the X axis in this example) that is perpendicular to the lasing axis 22A (the Z axis in FIG. 1C) and parallel to plane of laser sled.

Continuous wavelength tuning without mode hops is accomplished by proper motion of the grating 32 with respect to the gain medium 22 and the cavity optical assembly 26. More specifically, U.S. Pat. No. 7,733,925 provides the proper motion of the grating can be realized either by (i) rotation of the grating with respect to the properly selected pivot axis, or (ii) rotation around the properly selected pivot axis accompanied by the arbitrary motion of the pivot axis in a pivot plane. As far as permitted, the contents of U.S. Pat. No. 7,733,925 are incorporated herein by reference.

With at least some of the designs provided herein, the grating 32 is rotated about the properly selected pivot axis 38 that is defined in U.S. Pat. No. 7,733,925. Thus, with these designs, the wavelength tuning of the laser assembly 10 occurs without mode hops. With this design, the laser assembly 10 is able to accurately, finely, and smoothly tune throughout the spectral range without the influence of the cavity modes.

The angular range of the mover assembly 36 can be varied according to the design of the grating 32 and the desired spectral range of the laser assembly 10. In one non-exclusive embodiment, the mover assembly 36 provides an angular range plus or minus nine degrees (±9°). Alternatively, for example, the mover assembly 36 can be designed to rotate the grating 32 more than or less than approximately eighteen degrees.

The control system 30 controls the operation of the various components in the laser assembly 10, including (i) the gain medium 22, (ii) the mover assembly 36, and (iii) the temperature controller 20. Further, the control system 30 can receive feedback regarding the gain medium 22, temperature, and/or the position of the grating 32 to control these components. The control system 30 can direct power to the gain medium 22 in a pulsed fashion or constant wavelength. The control system 30 can include one or more processors. In one embodiment, the control system 30 includes an upper circuit board 30A and a lower circuit board 30B.

In one embodiment, the control system 30 includes a feedback assembly 30C that provides feedback regarding the gain medium 22 that is used for closed loop control of the current that is directed to the gain medium 22. In this embodiment, the feedback assembly 30C can include a current sense resistor that is used to determine the current being directed to the gain medium 22. Uniquely, in certain embodiments, the current sense resistor has a relatively high resistance. With this design, the current sense resistor will provide a relatively large signal, and any noise in the system will be relatively small. Thus, the feedback provided to the control system 30 will be more accurate. As alternative, non-exclusive examples, the current sense resistor can have a resistance of at least approximately 0.5, 0.6, 0.8, 0.7, 0.8, 0.9, 1, 1.2, 1.5, or 2 ohms.

Unfortunately, the relatively high resistance in the sense resistor will consume more power and will generate quite a bit of heat during operation. Further, as the temperature of sense resistor increases, the resistance increases and the accuracy of the signal decreases. In one embodiment, the feedback assembly 30C is secured to the lower circuit board 30B, and the lower circuit board 30B is thermally coupled to the housing base 14C. With this design, the temperature controller 15 (illustrated in FIG. 1A) that controls the temperature of the housing base 14C also removes the heat generated by and controls the temperature (provide temperature stabilization) of the sense resistor 30C.

Figure 2A:
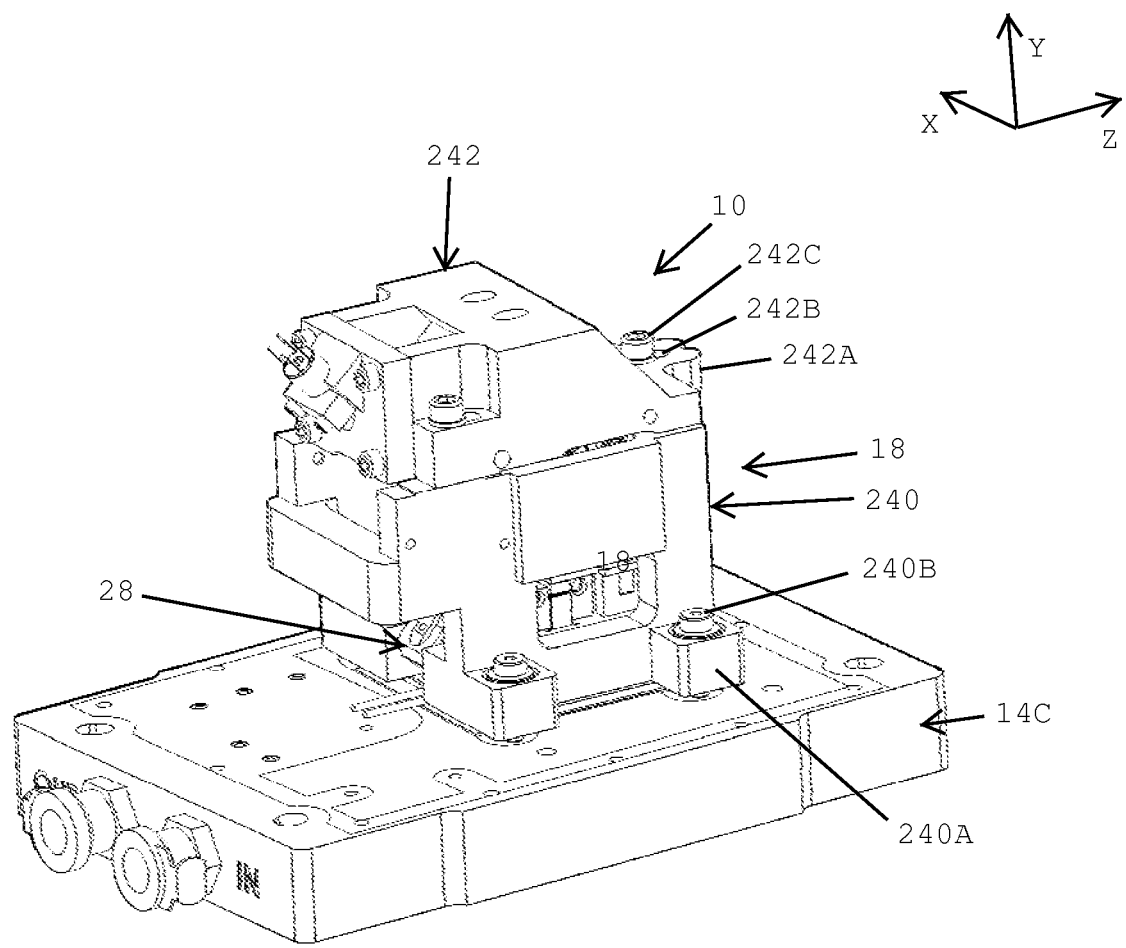
FIGS. 2A and 2B are alternative perspective views of a portion of the laser assembly.
Figure 2B:
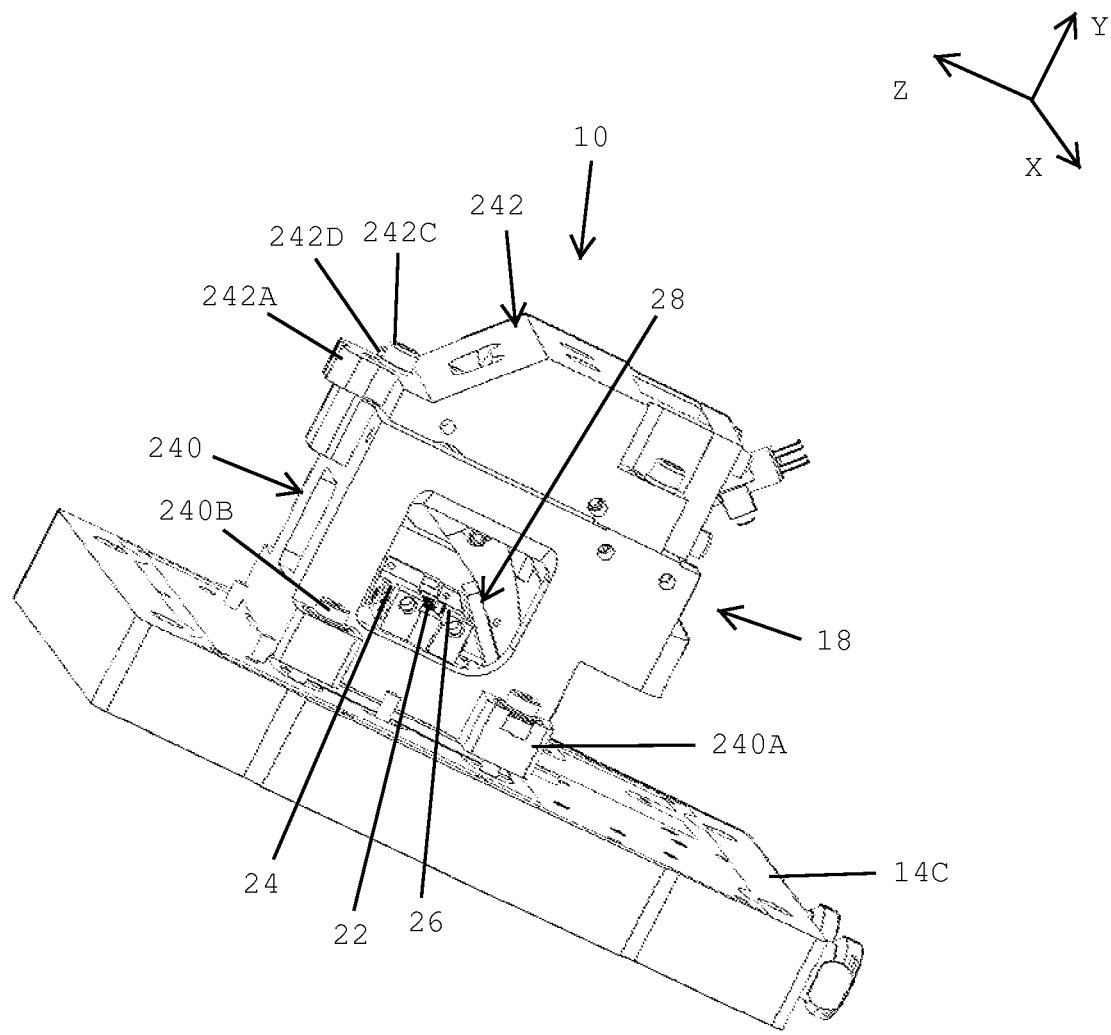
Figure 2C:
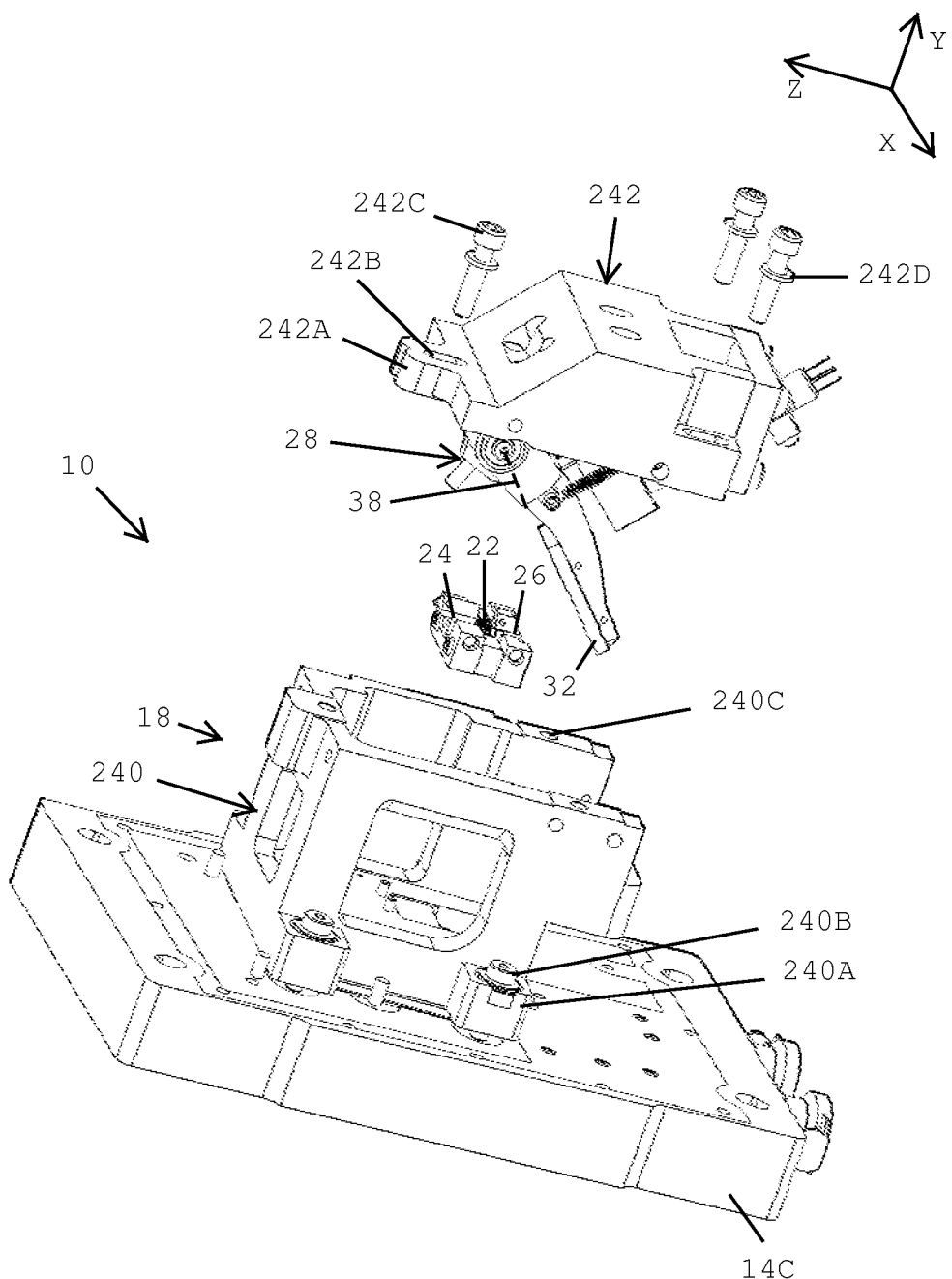
FIG. 2C is an exploded view of the portion of the laser assembly of FIG. 2B.

FIGS. 2A and 2B are alternative perspective views and FIG. 2C is a partly exploded view of a portion of the laser assembly 10, including (i) the frame assembly 18, (ii) the gain medium 22, (iii) the optical assemblies 24, 26, and (iv) the WD feedback assembly 28. In this embodiment, the frame assembly 18 is a two piece modular frame that includes (i) a rigid first frame 240; and (ii) a rigid second frame 242 that secured to the top of the first frame 240. The design of each frame 240, 242 can be varied to suit the design requirements of the laser assembly 10.

In one non-exclusive embodiment, the first frame 240 is somewhat rectangular frame shaped and is positioned around the gain medium 22, and the optical assemblies 24, 26, In this embodiment, the first frame 240 includes four, spaced apart, lower, first frame flanges 240A that each includes a flange aperture (not shown). With this design, a first fastener assembly 240B (e.g. four threaded bolts) can extend through the first frame flanges 240A and threaded into a corresponding internally threaded aperture in the housing base 14C to fixedly secure the first frame 240 to the housing base 14C. Additionally, the first frame 240 includes three spaced apart, internally treaded, upper frame apertures 240C that are used for securing the second frame 242 to the first frame 240.

The second frame 242 retains the WD feedback assembly 28. In one embodiment, the second frame 242 includes three, spaced apart second frame flanges 242A that each includes a flange aperture 242B. With this design, a second fastener assembly 242C (e.g. three threaded bolts) can extend through the second frame flanges 242A and be threaded into the frame apertures 240C of the first frame 240 to fixedly secure the second frame 242 to the first frame 240.

In this embodiment, each flange aperture 242B is an oversized, elongated slot. With this design, the second frame 242 and the WD feedback assembly 28 (i) can be slid along the Z axis relative to the gain medium 22 to selectively adjust the cavity length, and (ii) can be pivoted about the Y and X axes so that the plane of the face of the grating 32 and the pivot axis 38 are properly aligned relative to the lasing axis 22A (illustrated in FIG. 1C). After the WD feedback assembly 28 is properly positioned, the second fastener assembly 242C can be fully tightened. This can allow for fine tuning and possible mode hop free operation of the laser assembly 10. Additionally, the second fastener assembly 242C can include one or more washer stacks 242D that facilitate tightening of the second fastener assembly 242C without moving the second frame 242.

Figure 3A:
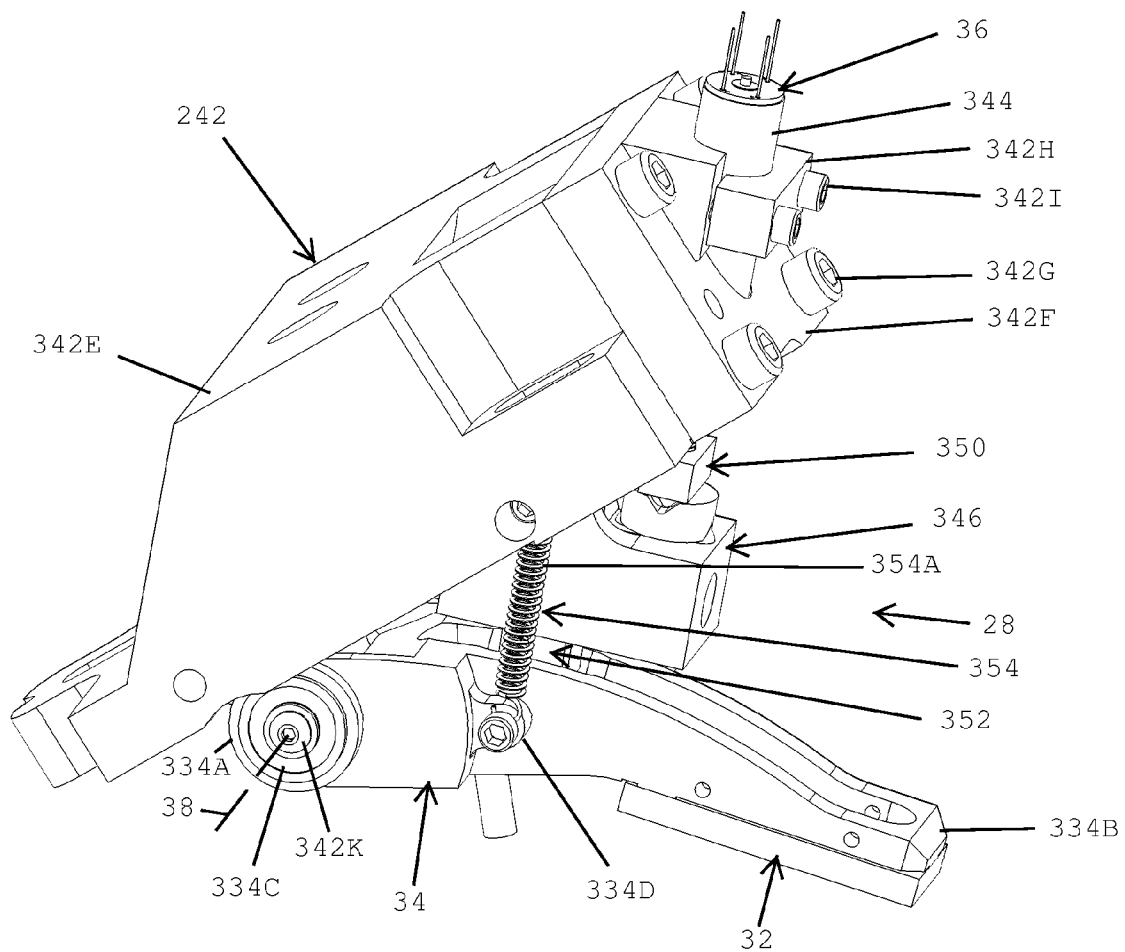
FIGS. 3A and 3B are alternative perspective views of another portion of the laser assembly.
Figure 3B:
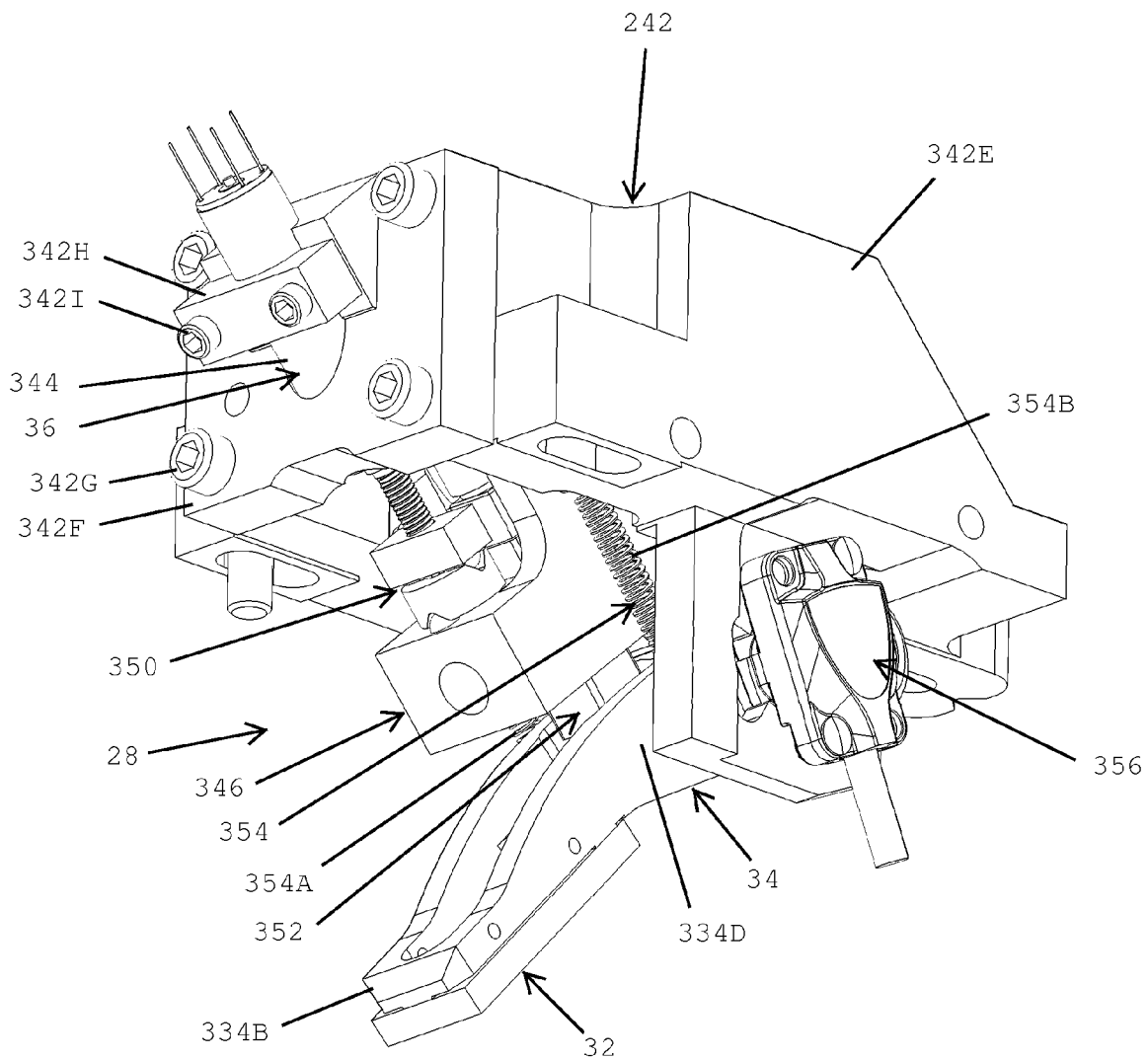
Figure 3C:
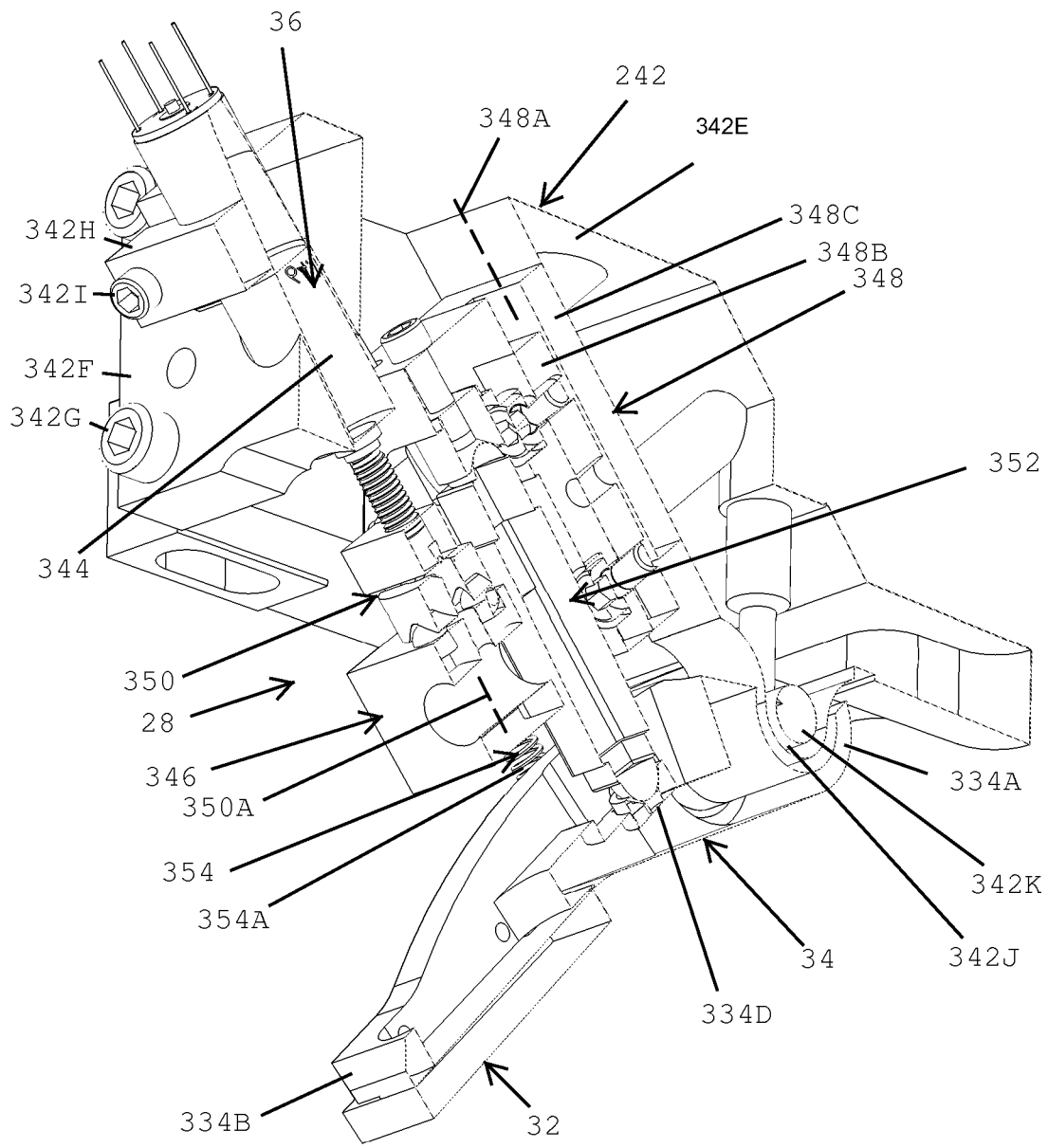
FIG. 3C is a cut-away view of FIG. 3B.

FIGS. 3A and 3B are alternative perspective views, and FIG. 3C is a cut-away view of the second frame 242, and the WD feedback assembly 28 including the grating 32, the grating arm 34, and the mover assembly 36 that selectively pivots the grating arm 34 and the grating 32 about the pivot axis 38. In this embodiment, the mover assembly 36 includes (i) a coarse ("gross"), first mover 344 that makes large scale movements to the grating arm 34, (ii) a stage 346, (iii) a stage guide 348, (iv) a mover connector 350, (v) a fine, second mover 352 that makes fine scale movements to the grating arm 34, (vii) a resilient assembly 354 that cooperate to accurately rotate the grating arm 34 about the pivot axis 38, and (viii) a measurement system 356 that monitors the movement or position of the grating 32 or something associated with the grating 32.

In this embodiment, the second frame 242 includes (i) a housing body 342E, (ii) a first rear flange 342F that is secured to the housing body 342E with a first flange fastener assembly 342G, and (iii) a second rear flange 342H that is secured to the first rear flange with a second flange fastener assembly 342I. In this embodiment, the first rear flange 342F can be removed to allow for the installation of the WD feedback assembly 28. Further, the second rear flange 342H is used to fixedly secure the coarse mover 344 to the second frame 242. Additionally, the second frame 242 can include (i) a frame opening 342J, (ii) a shaft 342K that is fits into the frame opening 342J, and (iii) a shaft fastener assembly (not shown in FIGS. 3A-3C) that fixedly secures the shaft 342K to the housing body 342E. In this embodiment, the shaft 342K is aligned with the pivot axis 38 and is used to pivot the grating arm 34.

The grating arm 34 includes a proximal end 334A, and a distal end 334B. In this embodiment, the proximal end 334A retains a pair of spaced apart bearing 334C (only one is visible in FIG. 3A) that are positioned on the shaft 342K so that the grating arm 34 freely pivots about the pivot axis 38.

As provided herein, the grating arm 34 includes an arm center location 334D that is located between the ends 334A, 334B that defines an approximate center of mass of the grating arm 34. In certain embodiments, the mover assembly 36 engages the grating arm 34 near the center location 334D. This will allow for more accurate rotation of the grating arm 34 because of the balance of force on the grating arm 34. Further, the design permits substantially the highest immunity of the tuning mechanism to internal mechanical noise.

The grating 32 is attached near the distal end 334B of the grating arm 34. In certain embodiment, the grating 32 is attached with a grating fastener assembly (not shown) that allows for adjustment of the grating 32 relative to the grating arm 34 and the pivot axis 38.

As provided above, the first mover 344 makes large scale movements to the grating arm 34 while the second mover 352 makes small scale movements to the grating arm 34. With this design, the first mover 344 can be used to move the grating arm 34 approximately to the desired location, and the second mover 352 can be used to precisely position the grating arm 34. With this two mover 344, 352 design, the mover assembly 36 is able to provide a relatively large, quick, and accurate movement of the grating arm 34. In alternative, non-exclusive embodiments, the first mover 344 has a stroke that is at least approximately 100, 500, 1000, 10000, 100000, 1000000, or 30000000 percent greater than the stroke of the second mover 352.

The design of each mover 344, 352 can be varied pursuant to the teachings provided herein. In certain embodiments, the movers 344, 352 act in series to push and pivot the grating arm 34 in one rotational direction (clockwise in FIG. 3A) about the pivot axis 38, and the resilient assembly 354 urges the grating arm 34 to pivot in the opposite rotational direction (counter-clockwise in FIG. 3A) about the pivot axis 38. In one embodiment, the resilient assembly 354 includes a pair of spaced apart resilient members 354A, 354B (e.g. springs) that extend between and are secured between the second frame 242 and the grating arm 34.

The stage 346 mechanically couples and allows for the connection of the first mover 344 to the second mover 352. Further, in certain embodiments, the stage 346 is only moved (via the coarse mover 344) when large scale movements of the grating arm 34 are required, and is held stable by the coarse mover 344 when only fine adjustment to the grating arm 34 (via the fine mover 352) is necessary. This will reduce the resonant frequency of the system during fine movements that will improve the accuracy of the fine movements.

The stage guide 348 guides the movement of the stage 346. In one embodiment, the stage guide 348 is a linear guide that allows for movement of the stage 346 along a single linear stage axis 348A, while inhibiting all other movement of the stage 346. In this embodiment, the stage guide 348 includes a first guide section 348B that is fixedly secured to the stage 346, and a second guide section 348C that is fixedly secured to the second frame 242. With this design, the guide sections 348B, 348C interact to allow for movement along a single stage axis 348A, while inhibiting (rejects) all other motion. In certain embodiments, the assembly is designed so that the stage guide 348 is substantially normal (perpendicular) to the arm center location 334D of the grating arm 34 at the center of the stroke of the mover assembly 36. This design will minimize the amount of misalignment at the beginning and end of the stroke caused by the linear motion of the stage 346 and the pivoting of the grating arm 34.

The mover connector 350 mechanically connects the coarse mover 344 to the stage 346. In certain embodiments, the mover connector 350 is a decoupler that transfers forces generated along a coarse force axis 350A that is substantially parallel to the stage axis 348A and about the coarse force axis 350A, while decoupling the other forces. With this design, any force generated by the coarse mover 344 along the coarse force axis 350A is transferred to the stage 346, while other forces generated by the coarse mover 344 that are not along or about the coarse force axis 350A are not transferred to the stage 346. Thus, the mover connector 350 will inhibit the transfer of out of axis forces to the stage 346 and reduce the disturbances transferred to the stage 346 and will allow for some misalignment of the coarse mover 344. This will allow for more accurate positioning of the grating 32 with the second mover 352.

The measurement system 356 provides feedback regarding the movement and/or position of the grating 32 to the control system 30 (illustrated in FIG. 1C) for closed loop control of the movers 344, 352. For example, the measurement system 356 can include a encoder, a light-based PSD, a capacitive sensor, a magnetic sensor, an inductive sensor, another type of position sensor, or any combination thereof. In one embodiment, the measurement system 356 is a rotary encoder that monitors the movement and/or position of the grating arm 34. With this design, a single measurement signal can be used for closed loop control of both movers 344, 352. Alternatively or additionally, the measurement system 356 can monitor the movement of one or both of the movers 344, 352. Still alternatively, the encoder can be positioned at another location.

Further, with this design, during manufacturing, the laser assembly can be calibrated to provide a correlation between each encoder count from the measurement system 356 and the wavelength of the output beam. Stated in another fashion, the laser assembly 10 can be calibrated at a plurality of grating 32 positions so that the wavelength of the output beam 12 can be determined by measuring the grating 32 position. For example, a look-up table can be utilized and stored by the control system 30.

Figure 4A:
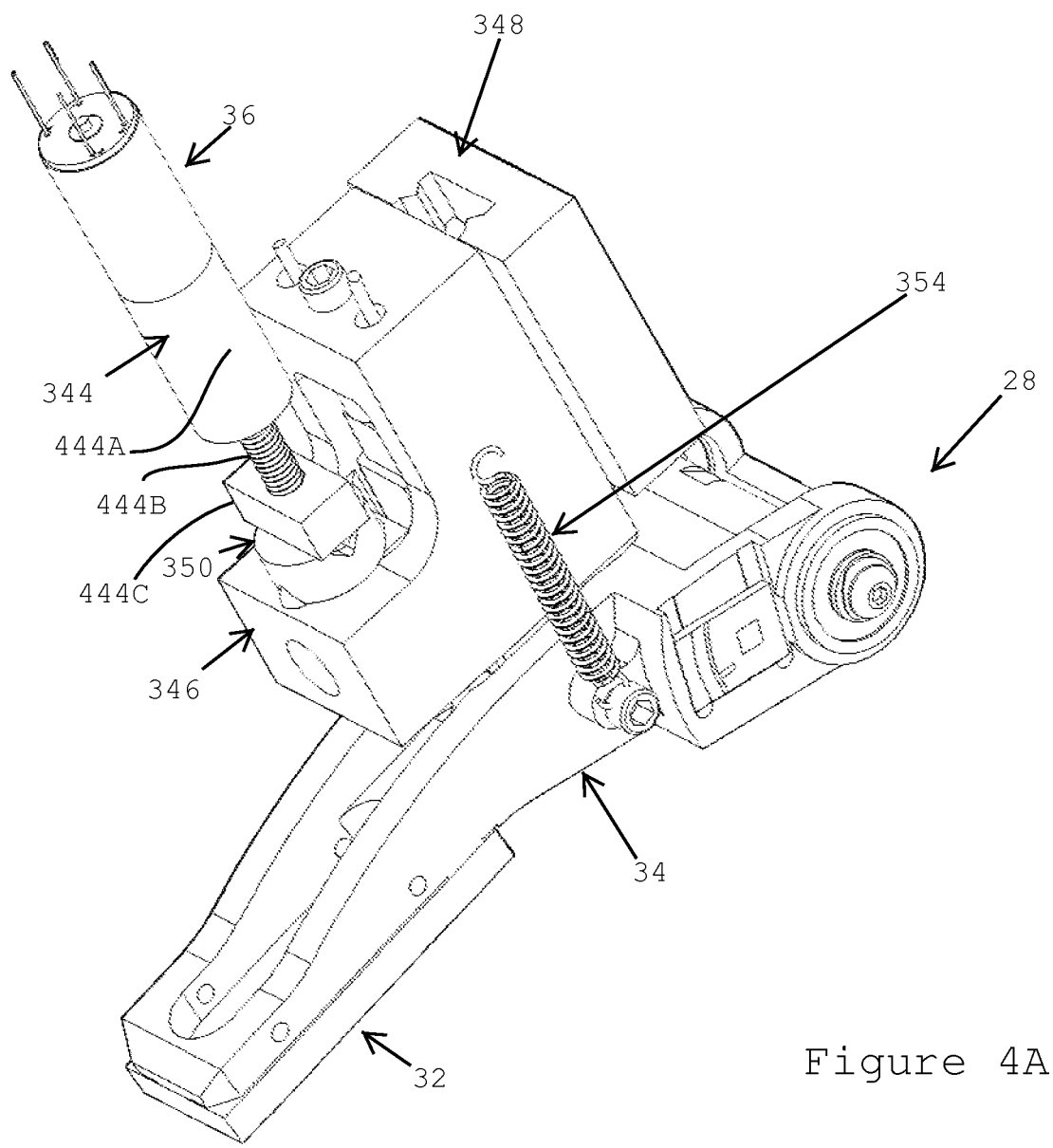
FIG. 4A is a perspective view.
Figure 4B:
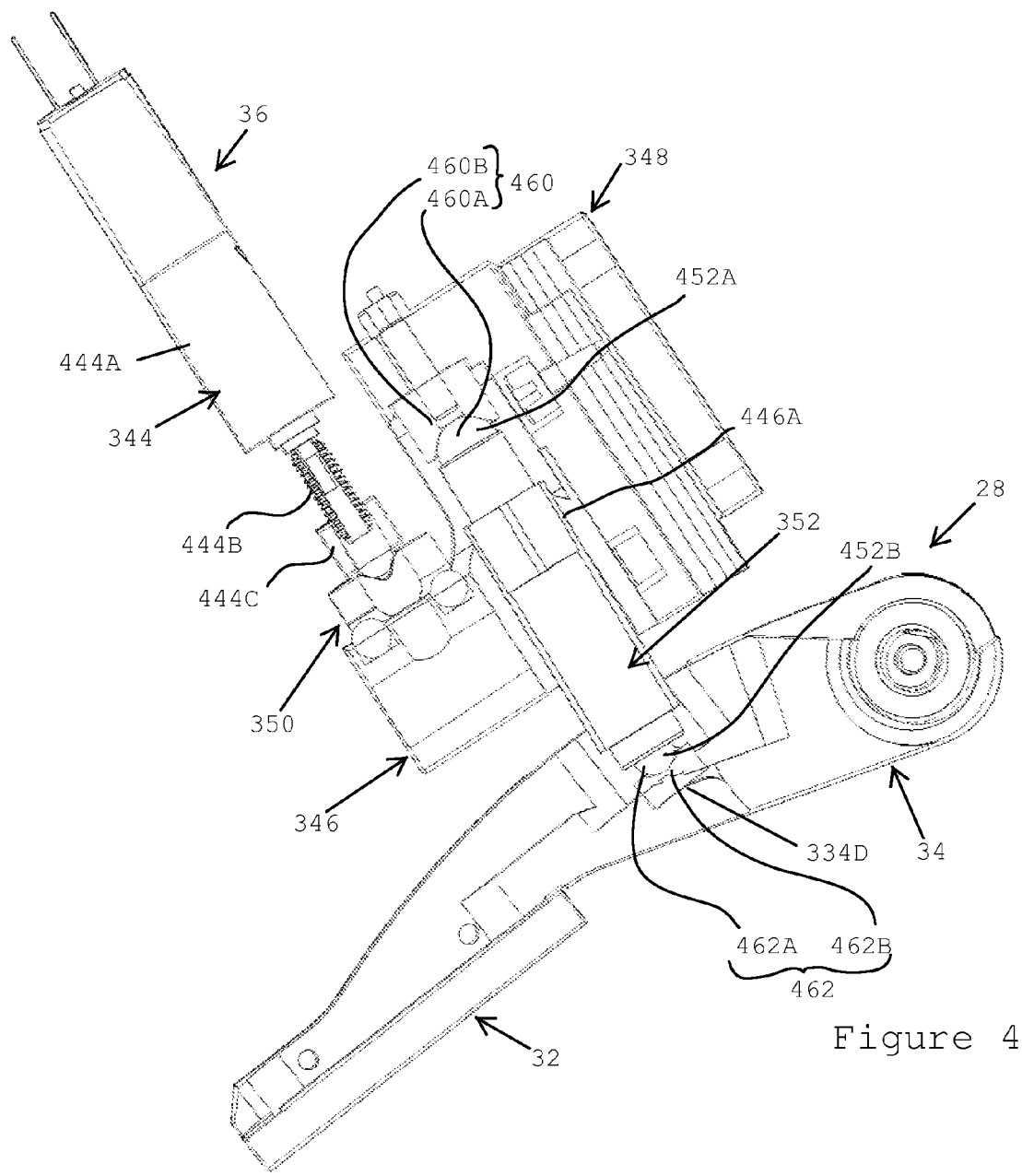
FIGS. 4B and 4C are alternative cut-away views of a feedback assembly having features of the present invention.
Figure 4C:
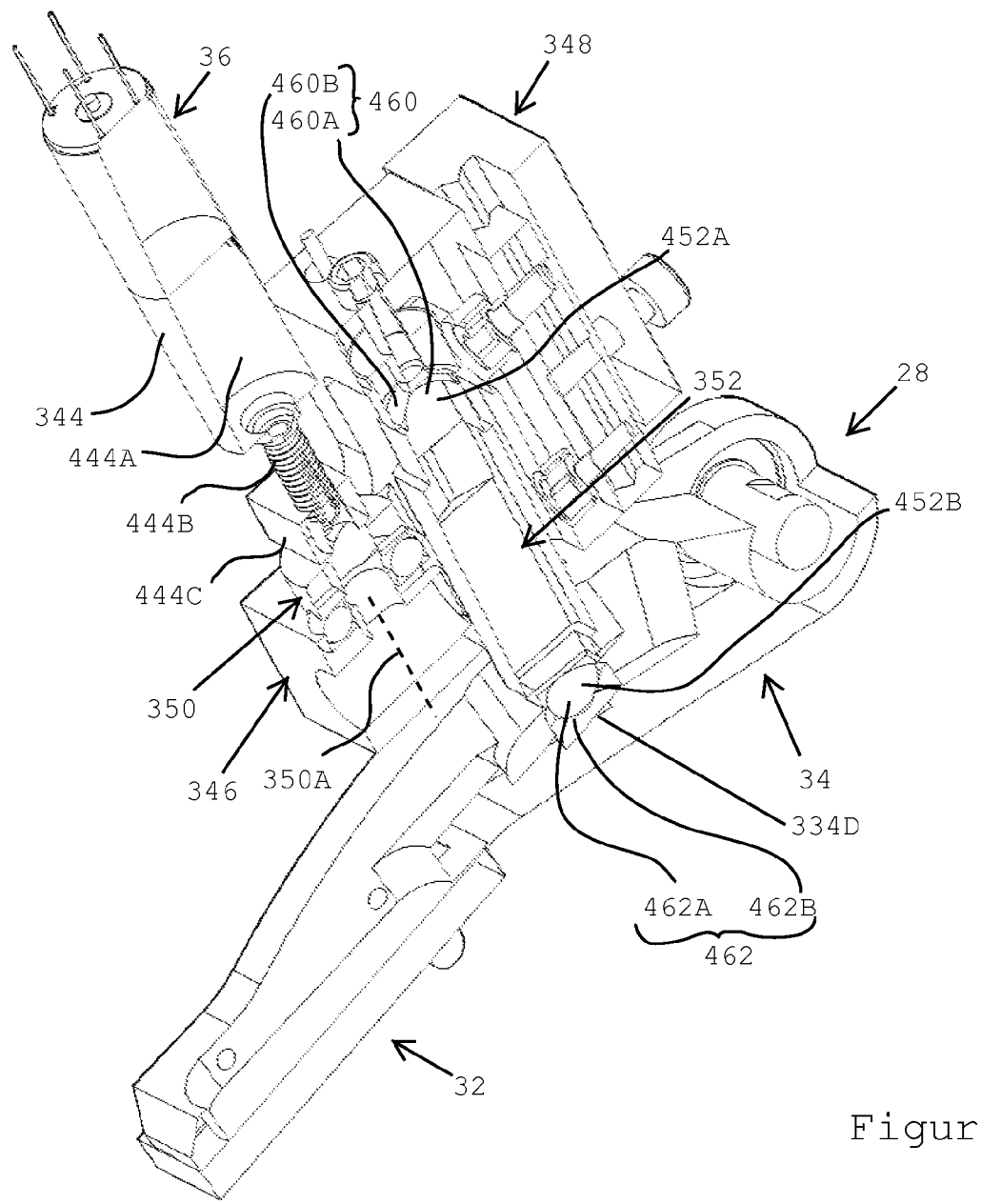

FIG. 4A is a perspective view, and FIGS. 4B and 4C are cut-away views of the feedback assembly 28, including (i) the grating 32, (i) the grating arm 34, and (iii) the mover assembly 36 including the first mover 344, the stage 346, the stage guide 348, the decoupling connector 350, the second mover 352, and the resilient assembly 354.

In this embodiment, the first mover 344 includes a rotary motor 444A that selectively rotates an externally threaded shaft 444B, and a mover frame 444C that includes an internally threaded aperture that matches and corresponds with the externally threaded shaft 444B. In this embodiment, the mover frame 444C is inhibited from rotating by the stage 346 via the decoupling connector 350. With this design, rotation of the shaft 444B in one direction will cause the mover frame 444C to move downward linearly along the coarse force axis 350A, and rotation of the shaft 444B in the other direction will cause the mover frame 444C to move upward linearly along the coarse force axis 350A. With this design, the control system 30 (illustrated in FIG. 1C) can direct current to the first mover 344 to rotate the shaft 444B and control the position of the mover frame 444C.

It should be noted that the resilient assembly 354 is secured between the second frame 242 (illustrated in FIG. 3C) and the grating arm 34, and the resilient assembly 354 always urges the mover frame 444C upward, via the second mover 352, the stage 346, and the mover connector 350. With this design, the mover frame 44C is always preloaded so there no backlash caused by looseness between threads of the shaft 444B and the mover frame 444C.

Further, the second mover 352 can be a piezoelectric actuator that extends between the stage 346 and the grating arm 34 and generates a substantially linear force on the grating arm 34. The second mover 352 can include a first actuator end 452A that engages the stage 346, and a second actuator end 452B that engages the grating arm 34 near the arm center location 334D. With this design, the control system 30 can direct current to the second mover 352 to control the length of the second mover 352.

In one embodiment, the second mover 352 is coupled to the stage 346 and the grating arm 34 in a unique fashion that compensates for the linear movement of the second mover 352 and the pivoting of the grating arm 34. In one embodiment, the first actuator end 452A forms a first joint 460 with the stage 346, and the second actuator end 452B forms a second joint 462 with the grating arm 34. In one, non-exclusive embodiment, the first joint 460 is a first ball and socket type joint (spheroidal connection), and the second joint 462 is also a second ball and socket type joint. With this design, the ball slides in the respective socket to compensate for the linear movement of the second mover 352 and the pivoting of the grating arm 34.

In this embodiment, (i) the first actuator end 452A includes a curved, convex surface 460A (e.g. a half of a sphere) and the stage 346 includes a curved concave surface 460B (indentation shaped like half a sphere) that receives the convex surface 460A; and (ii) the second actuator end 452B includes a curved, convex surface 462A (e.g. a half of a sphere) and the grating arm 34 includes a curved concave surface 462B (indentation shaped like half a sphere) that receives the convex surface 462A.

It should be noted that a piezoelectric actuator preserves it volume as it expands and contracts. The use of the joints 460, 462 provide for a stable connection between the second mover 352 and the stage 346 and the grating arm 34 regardless of these volume changes.

In this embodiment, the resilient assembly 354 maintains (holds in place) the grating arm 34 urged against the fine mover 352 to maintain the connection of the first joint 460, and the fine mover 352 urged against the stage 346 to maintain the connection of the second joint 462. Thus, as the fine mover 352 is lengthened, the resilient assembly 354 expands, and as the fine mover 352 is shortened, the resilient assembly 354 pulls the components together. As provided herein, the resilient assembly 354 should be stiff enough to inhibit chatter.

In FIGS. 4A-4C, the stage 346 has a "L" shaped cross-section and includes a stage aperture 446A that receives at least a portion of the fine mover 352. In one embodiment, the stage aperture 446A is large enough to allow for some pivoting of the fine mover 352 within the stage aperture 446A.

Figure 5A:
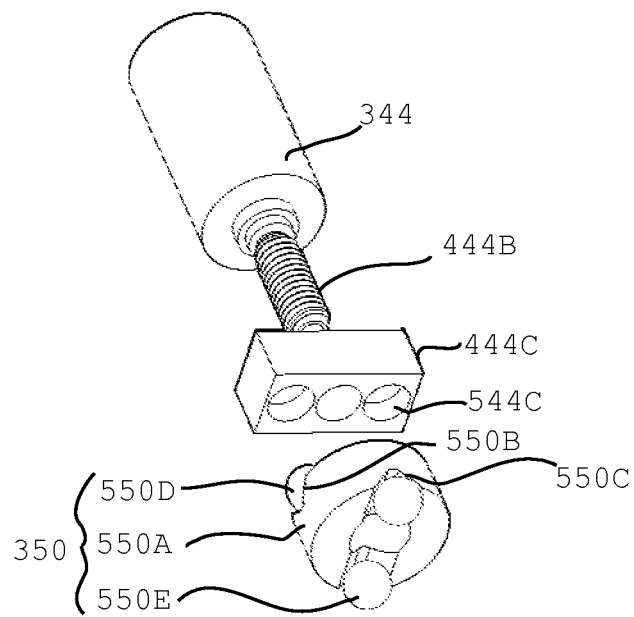
FIGS. 5A and 5B are alternative, exploded perspective views of a portion of a mover assembly having features of the present invention.
Figure 5A:
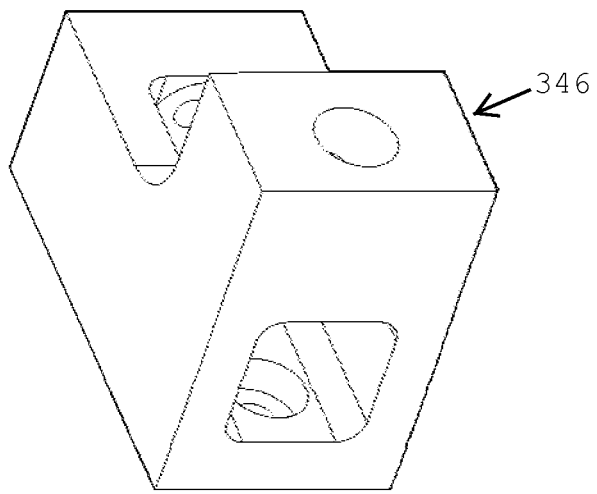
Figure 5B:
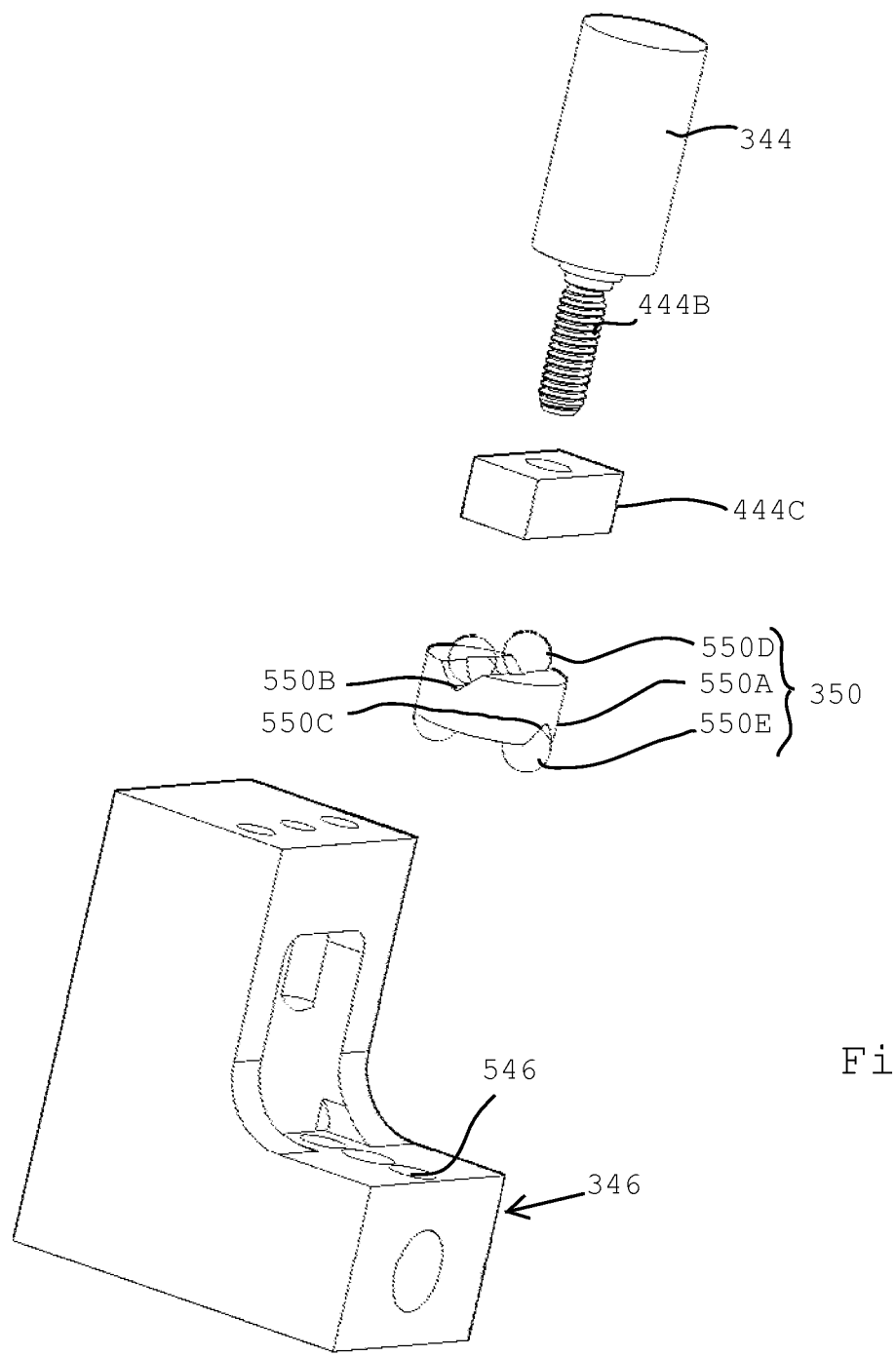

FIGS. 5A and 5B are alternative perspective views of the first mover 344, the mover connector 350, and the stage 346. In this embodiment, the mover connector 350 includes (i) a connector body 550A is somewhat disk shaped and includes a "V" shaped upper groove 550B, and a "V" shaped lower groove 550C; (ii) an upper pair of spaced apart balls 550D positioned in the upper groove 550B; and (iii) a lower pair of spaced apart balls 550E positioned in the lower groove 550C. Further, the mover frame 444C includes a pair of frame indentations 544C that receive the upper pair of balls 550D, and the stage 346 includes a pair of stage indentations 546 that receive the lower pair of balls 550E.

With this design, the mover connector 350 will transfer only pure translation and pure rotation (that is inhibited by the stage guide), while decoupling the other forces. With this design, any forces generated by the run-out of the threaded shaft 444B will not be transferred to the stage 346. Further, this design allows for some misalignment between the coarse mover 344 and the motion of the stage 346.

Alternatively, the mover connector 350 can have a design that is different than that illustrated in FIGS. 5A and 5B.

Figure 6A:
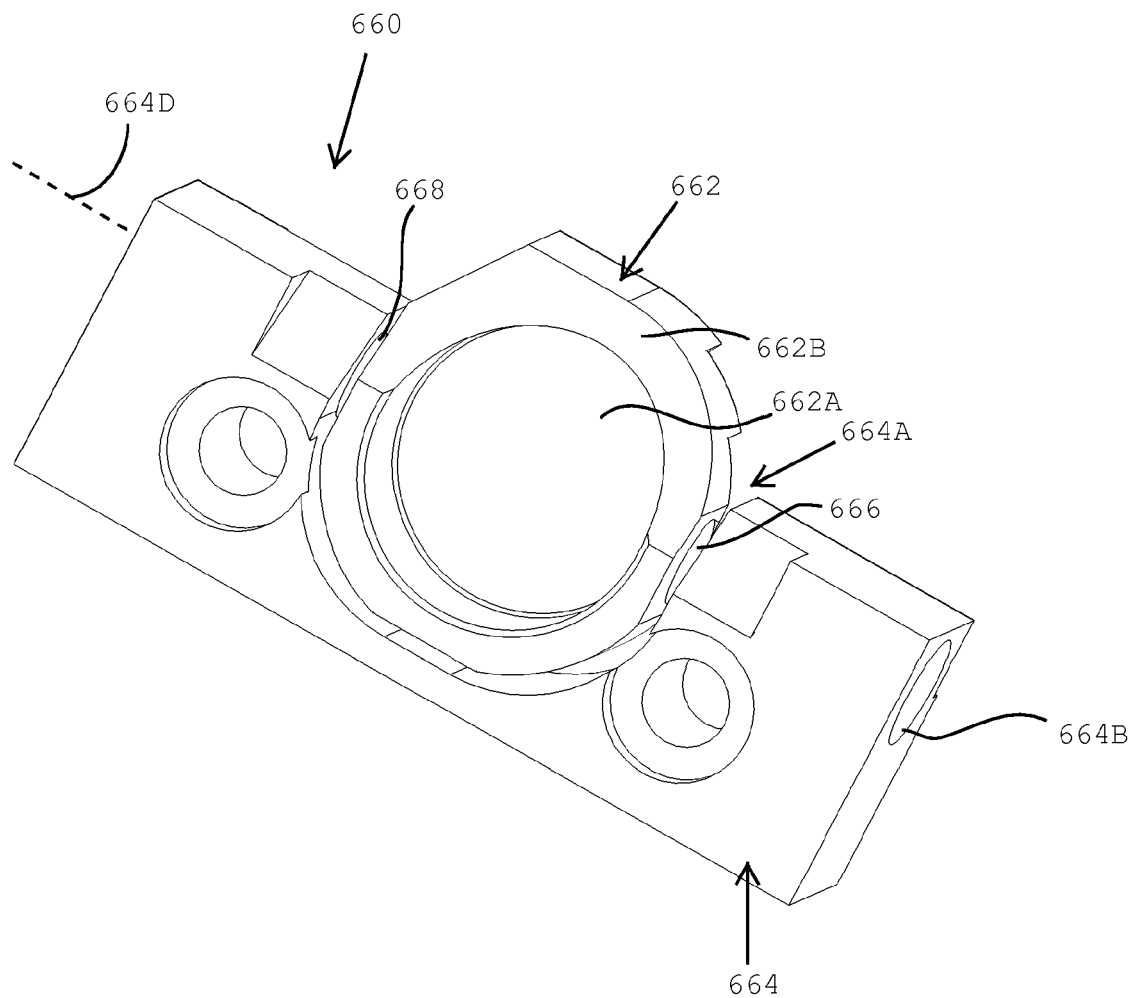
FIG. 6A is a perspective view of an optical assembly.
Figure 6B:
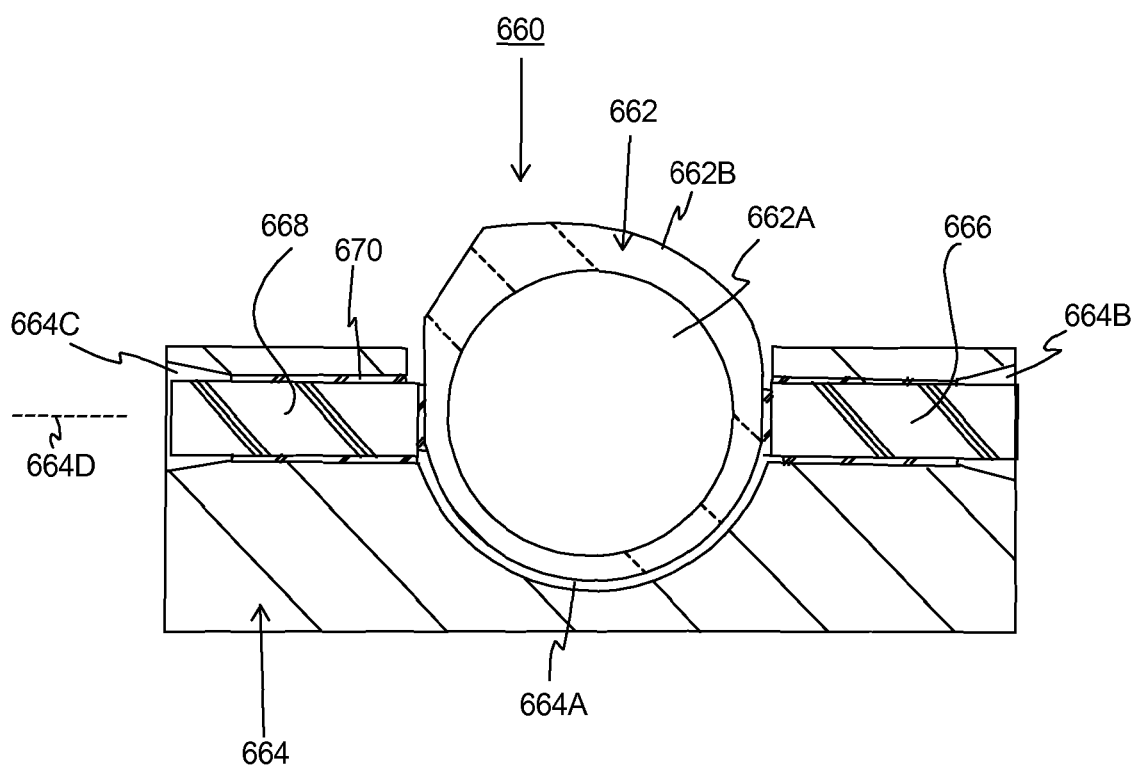
FIG. 6B is a cut-away view of the optical assembly of FIG. 6A.
Figure 6C:
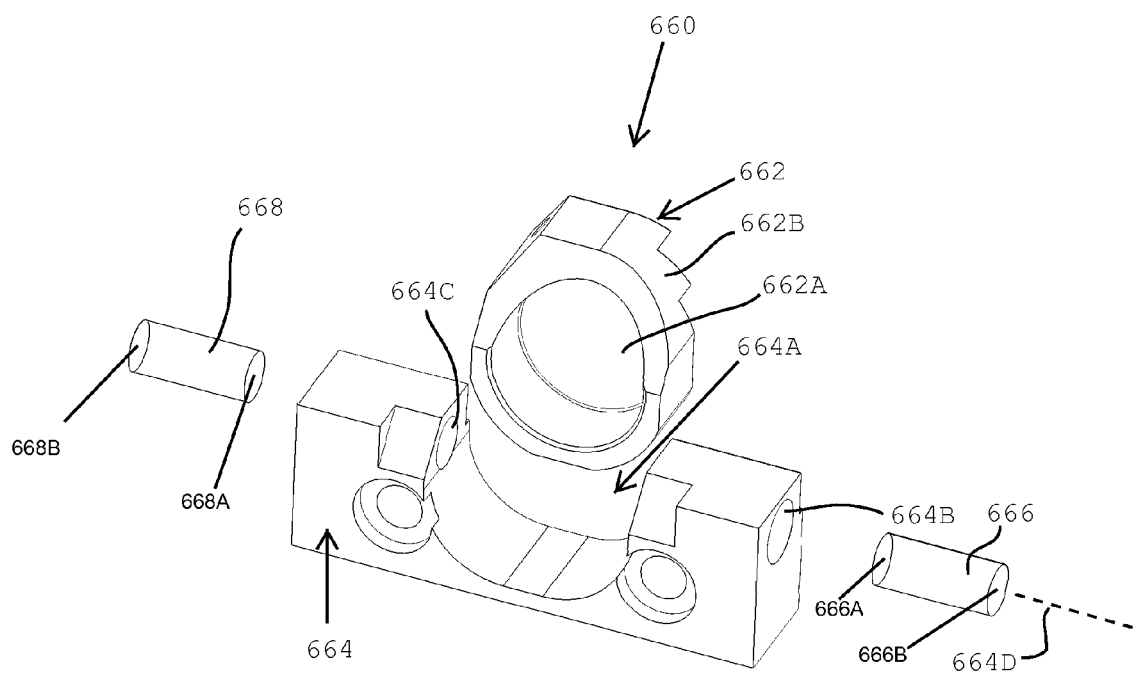
FIG. 6C is an exploded perspective view of the optical assembly of FIG. 6A.

FIG. 6A is a perspective view, FIG. 6B is a cut-away view, and FIG. 6C is an exploded perspective view of an optical assembly 660. As non-exclusive examples, the optical assembly 660 can be used as the output optical assembly 24 (illustrated in FIG. 1C) or the cavity optical assembly 26 (illustrated in FIG. 1C). In this embodiment, optical assembly 660 includes (i) an optical element 662; (ii) a rigid optical housing 664, (iii) a first rod 666, (iv) a second rod 668, and (v) an adhesive 670. With the present design, the optical assembly 660 is uniquely designed so that optical housing 664 can first be attached to the mounting base 16 (illustrated in FIG. 1C). Subsequently, the optical element 662 can be aligned with the other components (e.g. the lasing axis 22A of the gain medium 22 illustrated in FIG. 1C) and fixedly attached to the optical housing 664 with very limited access. The design of each of the components can be varied pursuant to the teachings provided herein.

In one embodiment, the optical element 662 is lens assembly that includes one or more lens 662A and a rigid, annular shaped lens housing 662B that encircles and retains the lens 662A. For example, in one embodiment, the lens 662A can be an aspherical lens having an optical axis that is aligned with the lasing axis 22A. In alternative, non-exclusive embodiments, the lens 662A has a diameter of less than approximately ten millimeters in diameter. For a Mid infrared application, the lens 662A can comprise materials selected from the group of Ge, ZnSe, ZnS Si, CaF, BaF or chalcogenide glass. However, other materials may also be utilized.

The optical housing 664 is rigid, and in this embodiment, the optical housing 664 is generally rectangular shaped, and includes a "U" shaped notch 664A that receives the optical element 662. Further, the optical housing 664 includes a first rod aperture 664B and a second rod aperture 664C that extend along and that are aligned along an aperture axis 664D that extends through the notch 664A. In this embodiment, each rod aperture 664B, 664C has a circular shaped cross-section. Alternatively, the rod apertures 664B, 664C can have another configuration.

The first rod 666 is generally cylindrical shaped, extends into the first rod aperture 664B, and is positioned near and engages the optical element 662. The first rod 666 includes a first end 666A and an opposed second end 666B. Similarly, the second rod 668 is generally cylindrical shaped, extends into the second rod aperture 664C, and is positioned near and engages the optical element 662. The second rod 668 includes a first end 668A and an opposed second end 668B. In this embodiment, each rod 666, 668 is rigid and can be made of glass. Alternatively, the shape of each rod 666, 668 can be different than cylindrical shaped.

The adhesive 670 (i) fixedly secures the first rod 666 to the optical element 662, and the first rod 666 to the optical housing 664; and (ii) fixedly secures the second rod 668 to the optical element 662, and the second rod 668 to the optical housing 664. In one embodiment, the adhesive 670 is cured with UV light.

With this design, the optical housing 664 can first be attached to the mounting base 16. Subsequently, the gain medium 22 can be power up, and the optical element 662 can be aligned (moved along the X, Y and Z axes) with the lasing axis 22A while holding the optical element 662 with a holding tool (not shown). Subsequently, the two rods 666, 668 can be inserted into the optical housing 664 with the adhesive 670 thereon until the rods 666, 668 engage the optical element 662 from opposite sides. Next, the adhesive 670 can be cured, e.g. via UV light, transmitted through the glass rods 666, 668. With this design, the rods 666, 668 retain the optical element 662 at two spaced apart, diametrically opposite locations. Further, with this design, the same radially accessible rod apertures 664B, 664C are used to apply the force with the rods 666, 668 and to cure the adhesive 670.

While a number of exemplary aspects and embodiments of a laser assembly 10 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A laser assembly comprising:
    a gain medium that generates a beam when electrical power is directed to the gain medium;
    a grating positioned in a path of the beam;
    a grating arm that retains the grating; and
    a mover assembly that moves the grating arm about a pivot axis, the mover assembly including a coarse mover that is adapted to make large scale movements of the grating arm about the pivot axis, and a fine mover that is adapted to make fine movements of the grating arm about the pivot axis.

2. The laser assembly of claim 1 wherein the mover assembly includes a stage that couples the coarse mover to the fine mover in series, and a stage guide that guides the motion of the stage so that the stage moves along a linear stage axis.

3. The laser assembly of claim 2 wherein the mover assembly includes a mover connector that connects the coarse mover to the stage, the mover connector transferring force along a coarse force axis that is substantially parallel to the stage axis, while decoupling other forces that are not substantially parallel to the stage axis.

4. The laser assembly of claim 3 wherein the fine mover is coupled to at least one of the stage and the grating arm with a ball and socket type joint.

5. The laser assembly of claim 4 wherein the mover assembly includes a resilient assembly that urges rotation of the grating arm in a first rotational direction relative to the pivot axis.

6. The laser assembly of claim 5 wherein the coarse mover includes a rotary motor, and the fine mover is a piezoelectric motor.

7. The laser assembly of claim 6 wherein the gain medium is a QC gain medium.

8. The laser assembly of claim 1 further comprising an optical assembly in the path of the beam, the optical assembly including an optical element, an optical housing including a rod aperture, and a rod that extends through the rod aperture and that is positioned near the optical element to retain the optical element.

9. The laser assembly of claim 1 further comprising a control system that directs power to the gain medium, the control system including a feedback assembly that provides feedback regarding the gain medium, and a temperature controller that controls the temperature of the feedback assembly.

10. A laser assembly comprising:
    a gain medium that generates a beam when electrical power is directed to the gain medium;
    a control system that directs power to the gain medium, the control system including a feedback assembly that provides feedback regarding the gain medium; wherein the feedback assembly includes a sense resistor having a relatively high resistance and wherein the feedback assembly provides feedback relating to the current being directed to the gain medium; and
    a temperature controller that controls the temperature of the feedback assembly.

11. The laser assembly of claim 10 further comprising a rigid base;
    wherein the feedback assembly is thermally coupled to the base, and wherein the temperature controller directs a circulation fluid through the base to control the temperature of the base and the feedback assembly.

12. The laser assembly of claim 11 further comprising (i) a grating positioned in the path of the beam; (ii) a grating arm that retains the grating;
    and (iii) a mover assembly that moves the grating arm relative to a pivot axis, the mover assembly including a coarse mover that is adapted to make large scale movements of the grating arm about the pivot axis, and a fine mover that is adapted to make fine movements of the grating arm about the pivot axis.

13. A laser assembly comprising:
    a gain medium that generates a beam when electrical power is directed to the gain medium;
    a grating positioned in a path of the beam;
    a grating arm that retains the grating; and
    a mover assembly that moves the grating arm about a pivot axis, the mover assembly including a coarse mover that is adapted to make large scale movements of the grating arm, and a fine mover that is adapted to make fine movements of the grating arm; wherein the mover assembly includes a stage that couples the coarse mover to the fine mover in series, and a stage guide that guides the motion of the stage so that the stage moves along a linear stage axis; and wherein the mover assembly includes a mover connector that connects the coarse mover to the stage, the mover connector transferring force along a coarse force axis that is substantially parallel to the stage axis, while decoupling other forces that are not substantially parallel to the stage axis.

14. The laser assembly of claim 13 wherein the fine mover is coupled to at least one of the stage and the grating arm with a ball and socket type joint.

15. The laser assembly of claim 14 wherein the mover assembly includes a resilient assembly that urges rotation of the grating arm in a first rotational direction relative to the pivot axis.

16. A laser assembly comprising:
a gain medium that generates a beam when electrical power is directed to the gain medium;
an optical assembly positioned in a path of the beam, the optical assembly including (i) an optical element; (ii) an optical housing including a first rod aperture; (iii) a first rod that extends through the first rod aperture and that is positioned near the optical element; and (iv) an adhesive that fixedly secures the first rod to the optical element and that fixedly secures the first rod to the optical housing;
a grating positioned in the path of the beam;
a grating arm that retains the grating; and
a mover assembly that moves the grating arm relative to a pivot axis, the mover assembly including a coarse mover that is adapted to make large scale movements of the grating arm about the pivot axis, and a fine mover that is adapted to make fine movements of the grating arm about the pivot axis.

17. The laser assembly of claim 16 wherein the optical housing includes a second rod aperture that is spaced apart from the first rod aperture, the rod apertures being aligned along an aperture axis; wherein the optical assembly includes a second rod that extends through the second rod aperture and that is positioned near optical element; and wherein the adhesive fixedly secures the second rod to the optical element and fixedly secures the second rod to the optical housing.

18. The laser assembly of claim 16 wherein the optical element includes an optical lens; wherein the adhesive fixedly secures the first rod to the optical housing with the first rod positioned in the first rod aperture; and wherein the adhesive fixedly secures an end of the first rod to the optical element.

* * * * *